US012588284B2

(12) United States Patent
Hu et al.

(10) Patent No.: US 12,588,284 B2
(45) Date of Patent: Mar. 24, 2026

(54) THIN-FILM TRANSISTOR AND MANUFACTURING METHOD THEREOF, AND DISPLAY SUBSTRATE

(71) Applicant: BOE Technology Group Co., Ltd., Beijing (CN)

(72) Inventors: Hehe Hu, Beijing (CN); Yan Qu, Beijing (CN); Jiayu He, Beijing (CN); Kun Zhao, Beijing (CN); Jie Huang, Beijing (CN); Zhengliang Li, Beijing (CN); Ce Ning, Beijing (CN); Dongfang Wang, Beijing (CN); Fengjuan Liu, Beijing (CN); Nianqi Yao, Beijing (CN); Feifei Li, Beijing (CN); Shunhang Zhang, Beijing (CN); Yunsik Im, Beijing (CN); Liping Lei, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 689 days.

(21) Appl. No.: 17/910,133

(22) PCT Filed: Dec. 27, 2021

(86) PCT No.: PCT/CN2021/141589
§ 371 (c)(1),
(2) Date: Sep. 8, 2022

(87) PCT Pub. No.: WO2023/122875
PCT Pub. Date: Jul. 6, 2023

(65) Prior Publication Data
US 2024/0204004 A1 Jun. 20, 2024

(51) Int. Cl.
*H10D 86/40* (2025.01)
*H10D 30/67* (2025.01)
*H10D 64/23* (2025.01)

(52) U.S. Cl.
CPC ....... *H10D 86/441* (2025.01); *H10D 30/6732* (2025.01); *H10D 30/6755* (2025.01);
(Continued)

(58) Field of Classification Search
CPC ............. H10D 64/258; H10D 30/6757; H10D 30/6732; H10D 86/441; H10D 30/6755; H10D 86/423
See application file for complete search history.

(56) References Cited

U.S. PATENT DOCUMENTS

2001/0040646 A1* 11/2001 Hannuki ........... G02F 1/134363
349/43
2002/0093474 A1 7/2002 Toyoshima et al.
(Continued)

FOREIGN PATENT DOCUMENTS

| CN | 1366284 A | 8/2002 |
|---|---|---|
| CN | 103838039 A | 6/2014 |
| CN | 104022157 A | 9/2014 |

*Primary Examiner* — Peter M Albrecht
(74) *Attorney, Agent, or Firm* — IPro, PLLC

(57) ABSTRACT

Provided are a thin-film transistor and a manufacturing method thereof, and a display substrate, belonging to the technical field of thin-film transistors. The thin-film transistor includes: a base substrate; a gate electrode on the base substrate; an active layer on a side of the gate electrode away from the base substrate, an orthographic projection of the active layer onto the base substrate overlapping with an orthographic projection of the gate electrode onto the base substrate; and a first electrode and a second electrode on a side of the active layer away from the base substrate, the first electrode being one of a source electrode and a drain electrode, and the second electrode being the other of the source electrode and the drain electrode. Specifically the active layer includes a channel region corresponding to a gap between the first electrode and the second electrode, and a width direction of the channel region is perpendicular or (Continued)

substantially perpendicular to an extending direction of the gate electrode. According to the embodiments of the present disclosure, the illumination stability of the thin-film transistor can be improved without reducing the transmittance of the substrate.

12 Claims, 2 Drawing Sheets

(52) U.S. Cl.
CPC ....... *H10D 30/6757* (2025.01); *H10D 64/258* (2025.01); *H10D 86/423* (2025.01)

(56) References Cited

U.S. PATENT DOCUMENTS

| | | | |
|---|---|---|---|
| 2002/0096676 A1* | 7/2002 | Pang ................. | H10D 30/6732 |
| | | | 257/40 |
| 2010/0123845 A1* | 5/2010 | Kim .................... | H10D 86/441 |
| | | | 349/46 |
| 2014/0014951 A1* | 1/2014 | Kawashima ....... | H10D 30/6757 |
| | | | 257/43 |
| 2016/0013209 A1* | 1/2016 | Yang ................... | H10D 86/441 |
| | | | 257/43 |
| 2016/0247941 A1 | 8/2016 | Um et al. | |
| 2018/0197883 A1* | 7/2018 | Cheng ................. | H10D 86/441 |

* cited by examiner

THIN-FILM TRANSISTOR AND MANUFACTURING METHOD THEREOF, AND DISPLAY SUBSTRATE

CROSS-REFERENCE TO RELATED APPLICATION

This application is the U.S. national phase of PCT Application No. PCT/CN2021/141589 filed on Dec. 27, 2021, the disclosure of which is incorporated in its entirety by reference herein.

TECHNICAL FIELD

The present disclosure relates to the technical field of thin-film transistors, and in particular, to a thin-film transistor and a manufacturing method thereof, and a display substrate.

BACKGROUND

At present, thin-film transistor (TFT) arrays have been widely used in flat panel displays, large-area X-ray detectors, fingerprint recognition and other fields. However, thin-film transistors using IGZO as the active layer have become the main candidate technology for the next generation of thin-film transistors due to their high mobility, good large-area uniformity, low off-state current, and few patterning processes.

However, high-mobility semiconductor materials such as IGZO have poor light stability, which limits the application of high-mobility semiconductor materials. In order to ensure the stability of the thin-film transistor, the size of the gate electrode needs to be increased to shield the thin-film transistor, which in turn affects the transmittance of the display substrate.

SUMMARY

The technical problem to be solved by the present disclosure is to provide a thin-film transistor and a manufacturing method thereof, and a display substrate, which can improve the illumination stability of the thin-film transistor without reducing the transmittance of the display substrate.

In order to solve the above technical problem, the embodiments of the present disclosure provide the following technical solutions.

In an aspect, there is provided a thin-film transistor, including: a base substrate; a gate electrode on the base substrate; an active layer on a side of the gate electrode away from the base substrate, an orthographic projection of the active layer onto the base substrate overlapping with an orthographic projection of the gate electrode onto the base substrate; and a first electrode and a second electrode on a side of the active layer away from the base substrate, the first electrode being one of a source electrode and a drain electrode, and the second electrode being the other of the source electrode and the drain electrode. Specifically the active layer includes a channel region corresponding to a gap between the first electrode and the second electrode, and a width direction of the channel region is perpendicular or substantially perpendicular to an extending direction of the gate electrode.

In some embodiments, the active layer includes a first boundary and a second boundary that are parallel or substantially parallel to the extending direction of the gate electrode, the gate electrode includes a third boundary and a fourth boundary that are parallel or substantially parallel to the extending direction of the gate electrode, and a distance between the first boundary and the third boundary is smaller than a distance between the first boundary and the fourth boundary.

In some embodiments, the shortest distance between the first boundary and the third boundary is b, and b is greater than 5 μm.

In some embodiments, the gate electrode includes a fifth boundary and a sixth boundary perpendicular to or substantially perpendicular to the extending direction of the gate electrode, the shortest distance between the fifth boundary and the sixth boundary is d, the channel region includes a seventh boundary and an eighth boundary perpendicular to or substantially perpendicular to the extending direction of the gate electrode, and the shortest distance between the seventh boundary and the eighth boundary is L, wherein a difference between d and L is less than or equal to 4 μm.

In some embodiments, an orthographic projection of at least one of the first electrode and the second electrode onto the base substrate does not overlap with the orthographic projection of the gate electrode on the base substrate.

In some embodiments, the orthographic projections of the first electrode and the second electrode onto the base substrate do not overlap with the orthographic projection of the gate electrode onto the base substrate, the shortest distance between a first orthographic projection of the first electrode onto the base substrate and a second orthographic projection of the gate electrode onto the base substrate is a, and the shortest distance between a third orthographic projection of the second electrode onto the base substrate and the second orthographic projection of the gate electrode onto the base substrate is also a.

In some embodiments, an orthographic projection of at least one of the first electrode and the second electrode onto the base substrate overlaps with the orthographic projection of the gate electrode on the base substrate.

In some embodiments, the orthographic projections of the first electrode and the second electrode onto the base substrate both overlap with the orthographic projection of the gate electrode onto the base substrate, a first overlap region between a first orthographic projection of the first electrode onto the base substrate and a second orthographic projection of the gate electrode onto the base substrate has a length a in the extending direction of the gate electrode, and a second overlap region between a third orthographic projection of the second electrode onto the base substrate and the second orthographic projection of the gate electrode onto the base substrate also has a length a in the extending direction of the gate electrode.

In some embodiments, a is smaller than or equal to 2 μm.

In some embodiments, the width of the first electrode in a direction perpendicular to the extending direction of the gate electrode is the same as the width of the second electrode in the direction perpendicular to the extending direction of the gate electrode, both being c.

In some embodiments, c is greater than W, a difference between c and W is 2-3 μm, and W is the width of a channel of the thin-film transistor.

An embodiment of the present disclosure further provides a display substrate, including the thin-film transistor described above, a gate electrode of the thin-film transistor being connected to a gate line of the display substrate, and an extending direction of the gate electrode being perpendicular or substantially perpendicular to the direction of the gate line.

In some embodiments, a data line of the display substrate is connected to the first electrode or the second electrode via a lead, and the lead is parallel or substantially parallel to the gate line.

An embodiment of the present disclosure further provides a method for manufacturing a thin-film transistor, including: providing a base substrate; forming a gate electrode on the base substrate; forming an active layer on a side of the gate electrode away from the base substrate, an orthographic projection of the active layer onto the base substrate overlapping with an orthographic projection of the gate electrode onto the base substrate; and forming a first electrode and a second electrode on a side of the active layer away from the base substrate, the first electrode being one of a source electrode and a drain electrode, and the second electrode being the other of the source electrode and the drain electrode. Specifically the active layer includes a channel region corresponding to a gap between the first electrode and the second electrode, and a width direction of the channel region is perpendicular or substantially perpendicular to an extending direction of the gate electrode.

REFERENCE NUMERALS LIST

Figure 1:
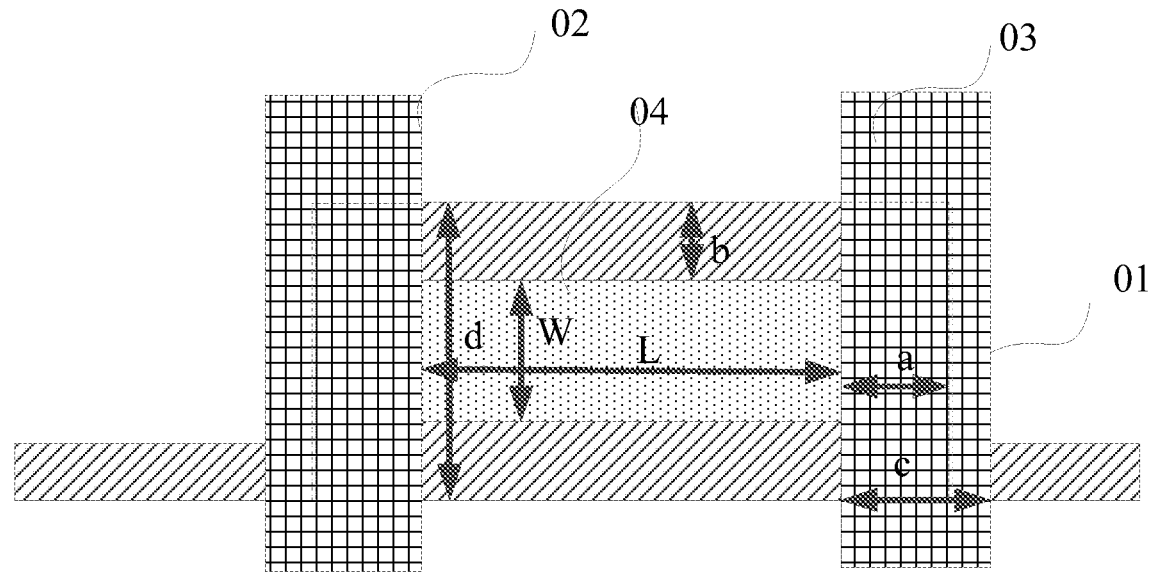
FIGS. 1 and 3 are schematic diagrams of thin-film transistors in accordance with the related art.

01 Gate electrode
02 First electrode
03 Second electrode
04 Active layer
041 First boundary
042 Second boundary
013 Third boundary
014 Fourth boundary
015 Fifth boundary
016 Sixth boundary
047 Seventh boundary
048 Eighth boundary

DETAILED DESCRIPTION

In order that the technical problems, technical solutions, and advantages to be solved by the embodiments of the present disclosure will become more apparent, a detailed description will be given below with reference to the accompanying drawings and specific embodiments.

Figure 3:
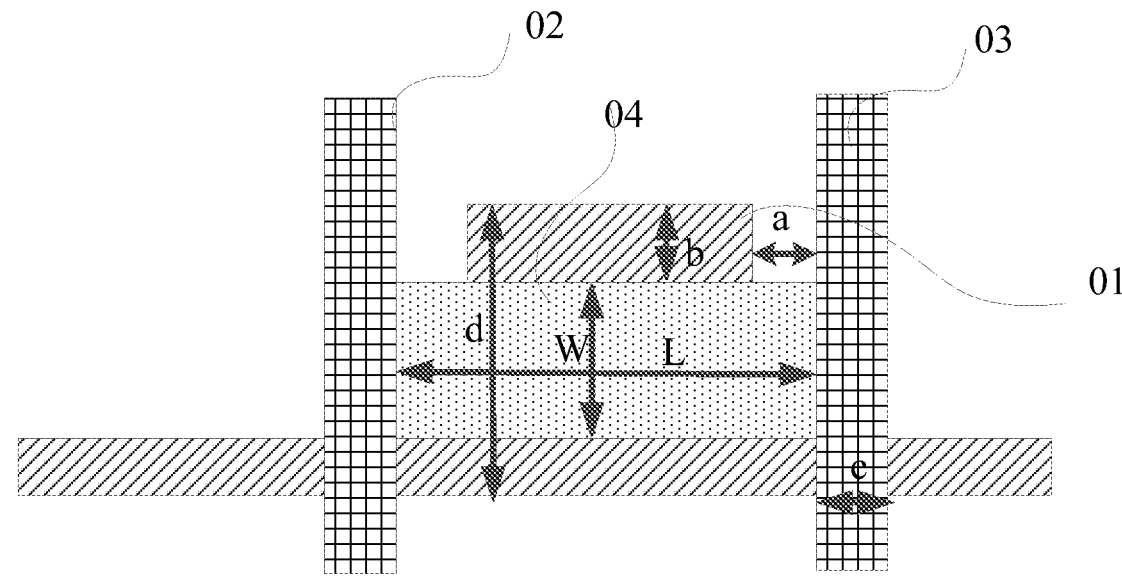

As shown in FIGS. 1 and 3, in a thin-film transistor in the related art, the extending direction of the gate electrode 01 is perpendicular or substantially perpendicular to the extending direction of the gate line, the extending direction of the gate electrode 01 is perpendicular or substantially perpendicular to the length direction (i.e., the direction indicated by L) of the channel region, and is parallel or substantially parallel to the width direction (i.e., the direction indicated by W) of the channel region. In order to prevent the active layer 04 from exposure to light, which affects the stability of the thin-film transistor, a large light shielding distance b needs to be designed so that the gate electrode 01 can shield the active layer 04. The light shielding distance b is the shortest distance between the boundary of the gate electrode 01 and the boundary of the active layer 04 in the direction of W.

However, if the light shielding distance b is increased, the width d of the gate electrode 01 increases, and the width of the black matrix (a black matrix parallel or substantially length direction of the channel region, so that the influence on the transmittance of the display substrate can be reduced.

Figure 2:
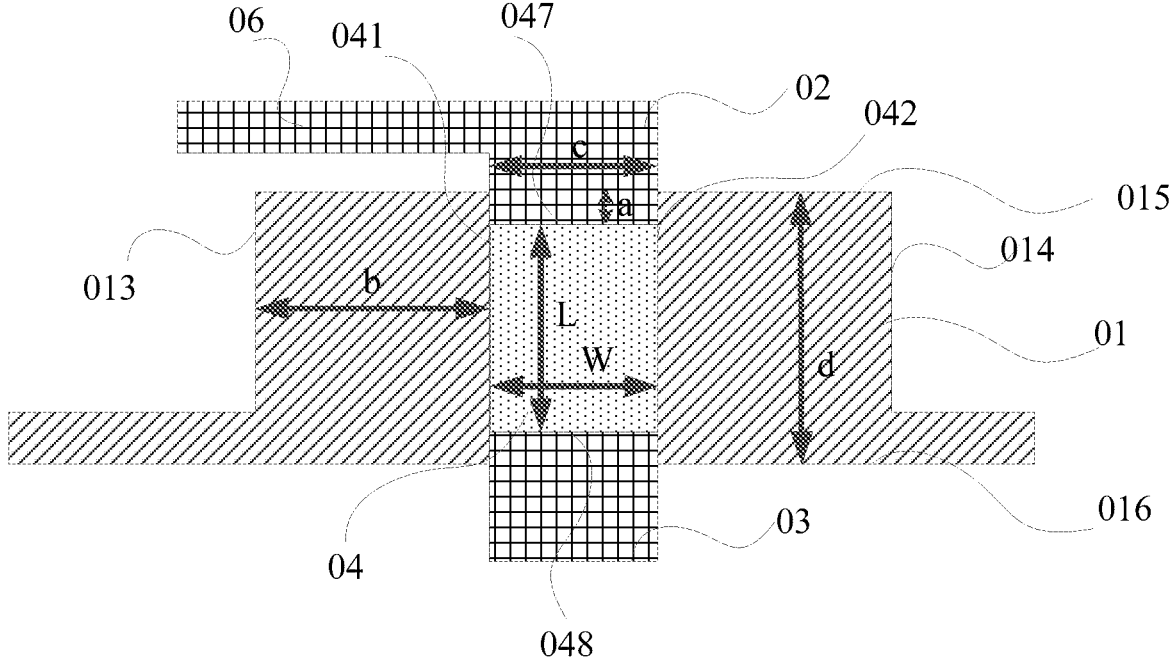
FIGS. 2 and 4 are schematic diagrams of thin-film transistors in accordance with embodiments of the present disclosure.

In an embodiment, as shown in FIG. 2, in the thin-film transistor of this embodiment, the extending direction of the gate electrode 01 is perpendicular or substantially perpendicular to the extending direction of the gate line, and the extending direction of the gate electrode 01 is parallel or substantially parallel to the length direction (i.e., the direction indicated by L) of the channel region and perpendicular or substantially perpendicular to the width direction (i.e., the direction indicated by W) of the channel region.

The active layer 04 includes a first boundary 041 and a second boundary 042 which are parallel or substantially parallel to the extending direction of the gate electrode 01, the gate electrode 01 includes a third boundary 013 and a fourth boundary 014 which are parallel or substantially parallel to the extending direction of the gate electrode 01, the distance between the first boundary 041 and the third boundary 013 is less than the distance between the first boundary 041 and the fourth boundary 014, and the shortest distance between the first boundary 041 and the third boundary 013 is equal to the shortest distance between the second boundary 042 and the fourth boundary 014, both being a light shielding distance b. In this embodiment, the active layer 04 is located in the middle position of the gate electrode 01, which ensures that the gate electrode 01 can shield both sides of the active layer 04.

Needless to say, the shortest distance between the first boundary 041 and the third boundary 013 may not be equal to the shortest distance between the second boundary 042 and the fourth boundary 014.

In order to ensure effective shielding towards the active layer 04, b is larger than 5 μm, but of course b may be smaller than 5 μm. In this embodiment, even if the light shielding distance b is increased, only the size of the gate electrode in the width direction of the channel region will be increased without increasing the size d of the gate electrode in the length direction of the channel region, and the width of the black matrix (a black matrix parallel or substantially parallel to the gate line) of the display substrate used for shielding the gate electrode 01 in the direction perpendicular or substantially perpendicular to the extending direction of the gate line does not need to be increased, so as to avoid the decrease in the transmittance of the display substrate. Furthermore, the increase in the size of the gate electrode in the width direction of the channel region does not increase the overlapping area of the gate electrode 01 with respect to the first electrode 02 and the second electrode 03, thus does not increase the parasitic capacitance between the gate electrode 01 and the first electrode 02 as well as the second electrode 03, thereby avoiding an increase in the power consumption of the display substrate.

In this embodiment, an orthographic projection of at least one of the first electrode 02 and the second electrode 03 onto the base substrate may overlap with the orthographic projection of the gate electrode 01 onto the base substrate.

In this embodiment, as shown in FIG. 2, the orthographic projections of the first electrode 02 and the second electrode 03 onto the base substrate both overlap with the orthographic projection of the gate electrode 01 onto the base substrate. And a first overlap region between a first orthographic projection of the first electrode 02 onto the base substrate and a second orthographic projection of the gate electrode 01 onto the base substrate has a length a in the extending direction of the gate electrode, and a second overlap region between a third orthographic projection of the second electrode 03 onto the base substrate and the second orthographic projection of the gate electrode 01 onto the base substrate also has a length a in the extending direction of the gate electrode.

In this embodiment, the width of the first electrode in a direction perpendicular to the extending direction of the gate electrode is the same as the width of the second electrode in the direction perpendicular to the extending direction of the gate electrode, both being c.

As shown in FIG. 2, the gate electrode 01 includes a fifth boundary 015 and a sixth boundary 016 which are perpendicular or substantially perpendicular to the extending direction of the gate electrode, and the shortest distance between the fifth boundary 015 and the sixth boundary 016 is d, i.e., the length of the gate electrode. The channel region includes a seventh boundary 047 and an eighth boundary 048 which are perpendicular or substantially perpendicular to the extending direction of the gate electrode, the shortest distance between the seventh boundary 047 and the eighth boundary 048 is L, namely, the length of the channel region, and the difference between d and L may be less than or equal to 4 μm.

In a particular example, the pixel density of the display substrate is 400, the pixel has a width of 21 μm in the extending direction of the gate line and a length of 63 μm in the extending direction perpendicular or substantially perpendicular to the gate line, the width W of the channel region is 5 μm, the length L of the channel region is 5 μm, a is 2 μm, b is greater than or equal to 5 μm, the width of the first electrode or the width of the second electrode in the direction perpendicular to the extending direction of the gate electrode is c, c is 2 μm, and the size of d is determined by the size of the active layer 04 and/or a, b.

In the case shown in FIG. 1, the overlapping area A1 between the first electrode 02 and the gate electrode 01 is equal to a*d, and the overlapping area A2 between the second electrode 03 and the gate electrode 01 is equal to a*d, where d is equal to W+2b. In order to ensure that the overlapping areas A1 and A2 are as small as possible, b is 5 μm, A1 is 30 μm², and A2 is 30 μm², which will increase the parasitic capacitance between the gate electrode 01 and the first electrode 02 and the second electrode 03, increasing the power consumption of the display substrate. Meanwhile, the width of the black matrix (the black matrix parallel or substantially parallel to the gate lines) of the display substrate to shield the gate electrode 01 in the direction perpendicular or substantially perpendicular to the extending direction of the gate lines also needs to be larger than d (i.e., 15 μm), resulting in a decrease in the transmittance of the display substrate.

In comparison, in this embodiment of the present disclosure, as shown in FIG. 2, the overlapping area A3 between the first electrode 02 and the gate electrode 01 is equal to a*c, and the overlapping area A4 between the second electrode 03 and the gate electrode 01 is equal to a*c, and both A3 and A4 are 4 μm², which is about 13% of the overlapping area shown in FIG. 1, so that the parasitic capacitance between the gate electrode 01 and the first electrode 02 as well as the second electrode 03 can be greatly reduced, and the power consumption of the display substrate can be reduced. In addition, the width of the black matrix (the black matrix parallel or substantially parallel to the gate line) of the display substrate for shielding the gate electrode 01 in the direction perpendicular or substantially perpendicular to the extending direction of the gate line only needs to be greater than d(L+2a=9 μm), which is about 60% of the width shown in FIG. 1, and the transmittance of the display substrate can be greatly improved. Meanwhile, since the width of the pixel in the extending direction of the gate line is 21 μm, b only needs to be less than (21−W)/2=(21−5)/2=8 μm, and the light shielding effect of the thin-film transistor can be greatly improved.

Figure 4:
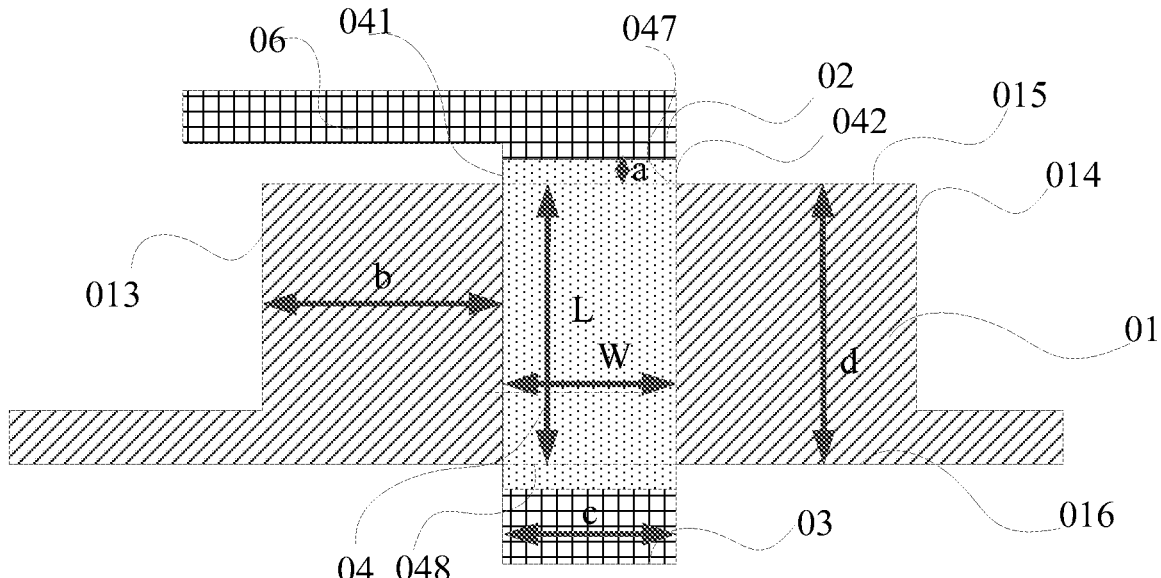

In another embodiment, as shown in FIG. 4, in the thin-film transistor of this embodiment, the extending direction of the gate electrode 01 is perpendicular or substantially perpendicular to the extending direction of the gate line, and the extending direction of the gate electrode 01 is parallel or substantially parallel to the length direction (i.e., the direction indicated by L) of the channel region and perpendicular or substantially perpendicular to the width direction (i.e., the direction indicated by W) of the channel region.

The active layer 04 includes a first boundary 041 and a second boundary 042 which are parallel or substantially parallel to the extending direction of the gate electrode 01, the gate electrode 01 includes a third boundary 013 and a fourth boundary 014 which are parallel or substantially parallel to the extending direction of the gate electrode, the distance between the first boundary 041 and the third boundary 013 is less than the distance between the first boundary 041 and the fourth boundary 014, and the shortest distance between the first boundary 041 and the third boundary 013 is equal to the shortest distance between the second boundary 042 and the fourth boundary 014, both being a light shielding distance b. In this embodiment, the active layer 04 is located in the middle position of the gate electrode 01, which ensures that the gate electrode 01 can shield both sides of the active layer 04.

In order to ensure effective shielding towards the active layer 04, b is larger than 5 μm. In this embodiment, even if the light shielding distance b is increased, only the size of the gate electrode in the width direction of the channel region will be increased without increasing the size d of the gate electrode in the length direction of the channel region, and the width of the black matrix (a black matrix parallel or substantially parallel to the gate line) of the display substrate used for shielding the gate electrode 01 in the direction perpendicular or substantially perpendicular to the extending direction of the gate line does not need to be increased, so as to avoid the decrease in the transmittance of the display substrate. Furthermore, the increase in the size of the gate electrode in the width direction of the channel region does not increase the overlapping area of the gate electrode 01 with respect to the first electrode 02 and the second electrode 03, and does not increase the parasitic capacitance between the gate electrode 01 and the first electrode 02 as well as the second electrode 03, thereby avoiding an increase in the power consumption of the display substrate.

In this embodiment, an orthographic projection of at least one of the first electrode 02 and the second electrode 03 onto the base substrate may not overlap with the orthographic projection of the gate electrode 01 on the base substrate.

In this embodiment, as shown in FIG. 4, the orthographic projections of the first electrode 02 and the second electrode 03 onto the base substrate both do not overlap with the orthographic projection of the gate electrode 01 onto the base substrate. Furthermore, the shortest distance between a first orthographic projection of the first electrode 02 onto the base substrate and a second orthographic projection of the gate electrode 01 onto the base substrate is a, and the shortest distance between a third orthographic projection of the second electrode 03 onto the base substrate and the second orthographic projection of the gate electrode 01 onto the base substrate is also a.

In this embodiment, the width of the first electrode 02 in a direction perpendicular to the extending direction of the gate electrode is the same as the width of the second electrode 03 in the direction perpendicular to the extending direction of the gate electrode, both being c. Of course, the width of the first electrode 02 in a direction perpendicular to the extending direction of the gate electrode also may be not equal to the width of the second electrode 03 in the direction perpendicular to the extending direction of the gate electrode.

As shown in FIG. 4, the gate electrode 01 includes a fifth boundary 015 and a sixth boundary 016 which are perpendicular or substantially perpendicular to the extending direction of the gate electrode, and the shortest distance between the fifth boundary 015 and the sixth boundary 016 is d, i.e., the length of the gate electrode. The channel region includes a seventh boundary 047 and an eighth boundary 048 which are perpendicular or substantially perpendicular to the extending direction of the gate electrode, and the shortest distance between the seventh boundary 047 and the eighth boundary 048 is L, namely, the length of the channel region.

In a particular example, the pixel density of the display substrate is 400, the pixel has a width of 21 μm in the extending direction of the gate line and a length of 63 μm in the extending direction perpendicular or substantially perpendicular to the gate line, the width W of the channel region is 5 μm, the length L of the channel region is 5 μm, a is 2 μm, b is greater than or equal to 5 μm, the width of the first electrode and the second electrode in the extending direction of the gate electrode is c, c is 2 μm, and the size of d is determined by the size of the active layer 04 and/or a, b.

In the case shown in FIG. 3, the overlapping area of the first electrode 02 and the gate electrode 01 is 0, and the overlapping area between the second electrode 03 and the gate electrode 01 is 0. The width of the black matrix (the black matrix parallel or substantially parallel to the gate lines) of the display substrate to shield the gate electrode 01 in the direction perpendicular or substantially perpendicular to the extending direction of the gate lines needs to be larger than d(W+2b), resulting in a decrease in the transmittance of the display substrate.

In comparison, in this embodiment of the present disclosure, as shown in FIG. 4, the overlapping area between the first electrode 02 and the gate electrode 01 is 0, the overlapping area between the second electrode 03 and the gate electrode 01 is 0, and the parasitic capacitance between the gate electrode 01 and the first electrode 02 as well as the second electrode 03 is infinitely small, which can reduce the power consumption of the display substrate. In addition, the width of the black matrix (the black matrix parallel or substantially parallel to the gate line) of the display substrate for shielding the gate electrode 01 in the direction perpendicular or substantially perpendicular to the extending direction of the gate line only needs to be greater than d(L=5 μm), which is about 33% of the width shown in FIG. 3, and the transmittance of the display substrate can be greatly improved. Meanwhile, since the width of the pixel in the extending direction of the gate line is 21 μm, b only needs to be less than $(21-W)/2=(21-5)/2=8$ μm, and the light shielding effect of the thin-film transistor can be greatly improved.

In an embodiment of the present disclosure, if there is an overlap among the orthographic projections of the first electrode and the second electrode and the gate electrode onto the base substrate, then d needs to be greater than L, and in order to ensure the transmittance of the display substrate, the difference between d and L is less than or equal to 4 μm. If the orthographic projections among the first and second electrodes and the gate electrode on the base substrate do not overlap, then d is equal to L.

If there is an overlap among the orthographic projections of the first electrode and the second electrode and the gate electrode onto the substrate, the area of the overlap depends on the values of a and c, and in order to reduce the power consumption of the display substrate, a may be less than or equal to 2 μm, c is greater than W, the difference between c and W is 2-3 μm, and W is the width of the channel of the thin-film transistor.

An embodiment of the present disclosure further provides a display substrate, including the thin-film transistor described above, a gate electrode of the thin-film transistor being connected to a gate line of the display substrate, and an extending direction of the gate electrode being perpendicular or substantially perpendicular to the direction of the gate line.

In some embodiments, as shown in FIGS. 2 and 4, the extending direction of a data line of the display substrate is perpendicular or substantially perpendicular to the extending direction of the gate line, the data line is connected to the first electrode or the second electrode via a lead 06; and the lead 06 is parallel or substantially parallel to the gate line.

An embodiment of the present disclosure further provides a display device including the display substrate described above. The display device includes, but is not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display device, etc.

The display device may be: any product or component with a display function, such as a television, a display, a digital photo frame, a mobile phone, a tablet computer, and among others, the display device further includes a flexible circuit board, a printed circuit board and a back panel.

An embodiment of the present disclosure further provides a method for manufacturing a thin-film transistor, including: providing a base substrate; forming a gate electrode on the base substrate; forming an active layer on a side of the gate electrode away from the base substrate, an orthographic projection of the active layer onto the base substrate overlapping with an orthographic projection of the gate electrode onto the base substrate; and forming a first electrode and a second electrode on a side of the active layer away from the base substrate, the first electrode being one of a source electrode and a drain electrode, and the second electrode being the other of the source electrode and the drain electrode. Specifically the active layer includes a channel region corresponding to a gap between the first electrode and the second electrode, and a width direction of the channel region is perpendicular or substantially perpendicular to an extending direction of the gate electrode.

In this embodiment, the width direction of the channel region of the active layer is perpendicular or substantially perpendicular to the extending direction of the gate electrode. In order to ensure the stability of the thin-film transistor, the light shielding distance of the gate electrode in the width direction of the channel region needs to be increased, and the size of the gate electrode in the width direction of the channel region increases without increasing the size of the gate electrode in the length direction of the channel region, so that the influence on the transmittance of the display substrate can be reduced.

In an embodiment, as shown in FIG. 2, in the thin-film transistor of this embodiment, the extending direction of the gate electrode 01 is perpendicular or substantially perpendicular to the extending direction of the gate line, and the extending direction of the gate electrode 01 is parallel or substantially parallel to the length direction (i.e., the direction indicated by L) of the channel region and perpendicular or substantially perpendicular to the width direction (i.e., the direction indicated by W) of the channel region.

The active layer 04 includes a first boundary 041 and a second boundary 042 which are parallel or substantially parallel to the extending direction of the gate electrode 01, the gate electrode 01 includes a third boundary 013 and a fourth boundary 014 which are parallel or substantially parallel to the extending direction of the gate electrode 01, the distance between the first boundary 041 and the third boundary 013 is less than the distance between the first boundary 041 and the fourth boundary 014, and the shortest distance between the first boundary 041 and the third boundary 013 is equal to the shortest distance between the second boundary 042 and the fourth boundary 014, both being a light shielding distance b. In this embodiment, the active layer 04 is located in the middle position of the gate electrode 01, which ensures that the gate electrode 01 can shield both sides of the active layer 04.

Needless to say, the shortest distance between the first boundary 041 and the third boundary 013 may not be equal to the shortest distance between the second boundary 042 and the fourth boundary 014.

In order to ensure effective shielding towards the active layer 04, b is larger than 5 μm, but of course b may be smaller than 5 μm. In this embodiment, even if the light shielding distance b is increased, only the size of the gate electrode in the width direction of the channel region will be increased without increasing the size d of the gate electrode in the length direction of the channel region, and the width of the black matrix (a black matrix parallel or substantially parallel to the gate line) of the display substrate used for shielding the gate electrode 01 in the direction perpendicular or substantially perpendicular to the extending direction of the gate line does not need to be increased, so as to avoid the decrease in the transmittance of the display substrate. Furthermore, the increase in the size of the gate electrode in the width direction of the channel region does not increase the overlapping area of the gate electrode 01 with respect to the first electrode 02 and the second electrode 03, thus does not increase the parasitic capacitance between the gate electrode 01 and the first electrode 02 as well as the second electrode 03, thereby avoiding an increase in the power consumption of the display substrate.

In this embodiment, an orthographic projection of at least one of the first electrode 02 and the second electrode 03 onto the base substrate may overlap with the orthographic projection of the gate electrode 01 onto the base substrate.

In this embodiment, as shown in FIG. 2, the orthographic projections of the first electrode 02 and the second electrode 03 onto the base substrate both overlap with the orthographic projection of the gate electrode 01 onto the base substrate. Specifically a first overlap region between a first orthographic projection of the first electrode 02 onto the base substrate and a second orthographic projection of the gate electrode 01 onto the base substrate has a length a in the extending direction of the gate electrode, and a second overlap region between a third orthographic projection of the second electrode 03 onto the base substrate and the second orthographic projection of the gate electrode 01 onto the base substrate also has a length a in the extending direction of the gate electrode.

In this embodiment, the width of the first electrode in a direction perpendicular to the extending direction of the gate electrode is the same as the width of the second electrode in the direction perpendicular to the extending direction of the gate electrode, both being c.

As shown in FIG. 2, the gate electrode 01 includes a fifth boundary 015 and a sixth boundary 016 which are perpendicular or substantially perpendicular to the extending direction of the gate electrode, and the shortest distance between the fifth boundary 015 and the sixth boundary 016 is d, i.e., the length of the gate electrode. The channel region includes a seventh boundary 047 and an eighth boundary 048 which are perpendicular or substantially perpendicular to the extending direction of the gate electrode, the shortest distance between the seventh boundary 047 and the eighth boundary 048 is L, namely, the length of the channel region, and the difference between d and L may be less than or equal to 4 μm.

In a particular example, the pixel density of the display substrate is 400, the pixel has a width of 21 μm in the extending direction of the gate line and a length of 63 μm in the extending direction perpendicular or substantially perpendicular to the gate line, the width W of the channel region is 5 μm, the length L of the channel region is 5 μm, a is 2 μm, b is greater than or equal to 5 μm, the width of the first electrode or the width of the second electrode in the extending direction of the gate electrode is c, c is 2 μm, and the size of d is determined by the size of the active layer 04 and/or a, b.

In the case shown in FIG. 1, the overlapping area A1 between the first electrode 02 and the gate electrode 01 is equal to a*d, and the overlapping area A2 between the second electrode 03 and the gate electrode 01 is equal to a*d, where d is equal to W+2b. In order to ensure that the overlapping areas A1 and A2 are as small as possible, b is 5 μm, A1 is 30 μm², and A2 is 30 μm², which will increase the parasitic capacitance between the gate electrode 01 and the first electrode 02 and the second electrode 03, increasing the power consumption of the display substrate. Meanwhile, the width of the black matrix (the black matrix parallel or substantially parallel to the gate lines) of the display substrate to shield the gate electrode 01 in the direction perpendicular or substantially perpendicular to the extending direction of the gate lines also needs to be larger than d (i.e., 15 μm), resulting in a decrease in the transmittance of the display substrate.

In comparison, in this embodiment of the present disclosure, as shown in FIG. 2, the overlapping area A3 between the first electrode 02 and the gate electrode 01 is equal to a*c, and the overlapping area A4 between the second electrode 03 and the gate electrode 01 is equal to a*c, and both A3 and A4 are 4 μm², which is about 13% of the overlapping area shown in FIG. 1, so that the parasitic capacitance between the gate electrode 01 and the first electrode 02 as well as the second electrode 03 can be greatly reduced, and the power consumption of the display substrate can be reduced. In addition, the width of the black matrix (the black matrix parallel or substantially parallel to the gate line) of the display substrate for shielding the gate electrode 01 in the direction perpendicular or substantially perpendicular to the extending direction of the gate line only needs to be greater than d(L+2a=9 μm), which is about 60% of the width shown in FIG. 1, and the transmittance of the display substrate can be greatly improved. Meanwhile, since the width of the pixel in the extending direction of the gate line is 21 μm, b only needs to be less than (21-W)/2=(21-5)/2=8 μm, and the light shielding effect of the thin-film transistor can be greatly improved.

In another embodiment, as shown in FIG. 4, in the thin-film transistor of this embodiment, the extending direction of the gate electrode 01 is perpendicular or substantially perpendicular to the extending direction of the gate line, and the extending direction of the gate electrode 01 is parallel or substantially parallel to the length direction (i.e., the direction indicated by L) of the channel region and perpendicular or substantially perpendicular to the width direction (i.e., the direction indicated by W) of the channel region.

The active layer 04 includes a first boundary 041 and a second boundary 042 which are parallel or substantially parallel to the extending direction of the gate electrode 01, the gate electrode 01 includes a third boundary 013 and a fourth boundary 014 which are parallel or substantially parallel to the extending direction of the gate electrode, the distance between the first boundary 041 and the third boundary 013 is less than the distance between the first boundary 041 and the fourth boundary 014, and the shortest distance between the first boundary 041 and the third boundary 013 is equal to the shortest distance between the second boundary 042 and the fourth boundary 014, both being a light shielding distance b. In this embodiment, the active layer 04 is located in the middle position of the gate electrode 01, which ensures that the gate electrode 01 can shield both sides of the active layer 04.

In order to ensure effective shielding towards the active layer 04, b is larger than 5 μm. In this embodiment, even if the light shielding distance b is increased, only the size of the gate electrode in the width direction of the channel region will be increased without increasing the size d of the gate electrode in the length direction of the channel region, and the width of the black matrix (a black matrix parallel or substantially parallel to the gate line) of the display substrate used for shielding the gate electrode 01 in the direction perpendicular or substantially perpendicular to the extending direction of the gate line does not need to be increased, so as to avoid the decrease in the transmittance of the display substrate. Furthermore, the increase in the size of the gate electrode in the width direction of the channel region does not increase the overlapping area of the gate electrode 01 with respect to the first electrode 02 and the second electrode 03, and does not increase the parasitic capacitance between the gate electrode 01 and the first electrode 02 as well as the second electrode 03, thereby avoiding an increase in the power consumption of the display substrate.

In this embodiment, an orthographic projection of at least one of the first electrode 02 and the second electrode 03 onto the base substrate may not overlap with the orthographic projection of the gate electrode 01 on the base substrate.

In this embodiment, as shown in FIG. 4, the orthographic projections of the first electrode 02 and the second electrode 03 onto the base substrate both do not overlap with the orthographic projection of the gate electrode 01 onto the base substrate. And the shortest distance between a first orthographic projection of the first electrode 02 onto the base substrate and a second orthographic projection of the gate electrode 01 onto the base substrate is a, and the shortest distance between a third orthographic projection of the second electrode 03 onto the base substrate and the second orthographic projection of the gate electrode 01 onto the base substrate is also a.

In this embodiment, the width of the first electrode 02 in a direction perpendicular to the extending direction of the gate electrode is the same as the width of the second electrode 03 in the direction perpendicular to the extending direction of the gate electrode, both being c. Of course, the width of the first electrode 02 in a direction perpendicular to the extending direction of the gate electrode also may be not equal to the width of the second electrode 03 in the direction perpendicular to the extending direction of the gate electrode.

As shown in FIG. 4, the gate electrode 01 includes a fifth boundary 015 and a sixth boundary 016 which are perpendicular or substantially perpendicular to the extending direction of the gate electrode, and the shortest distance between the fifth boundary 015 and the sixth boundary 016 is d, i.e., the length of the gate electrode. The channel region includes a seventh boundary 047 and an eighth boundary 048 which are perpendicular or substantially perpendicular to the extending direction of the gate electrode, and the shortest distance between the seventh boundary 047 and the eighth boundary 048 is L, namely, the length of the channel region.

In a particular example, the pixel density of the display substrate is 400, the pixel has a width of 21 μm in the extending direction of the gate line and a length of 63 μm in the extending direction perpendicular or substantially perpendicular to the gate line, the width W of the channel region is 5 μm, the length L of the channel region is 5 μm, a is 2 μm, b is greater than or equal to 5 μm, the width of the first electrode and the second electrode in the extending direction of the gate electrode is c, c is 2 μm, and the size of d is determined by the size of the active layer 04 and/or a, b.

In the case shown in FIG. 3, the overlapping area of the first electrode 02 and the gate electrode 01 is 0, and the overlapping area between the second electrode 03 and the gate electrode 01 is 0. The width of the black matrix (the black matrix parallel or substantially parallel to the gate lines) of the display substrate to shield the gate electrode 01 in the direction perpendicular or substantially perpendicular to the extending direction of the gate lines needs to be larger than d(W+2b), resulting in a decrease in the transmittance of the display substrate.

In comparison, in this embodiment of the present disclosure, as shown in FIG. 4, the overlapping area between the first electrode 02 and the gate electrode 01 is 0, the overlapping area between the second electrode 03 and the gate electrode 01 is 0, and the parasitic capacitance between the gate electrode 01 and the first electrode 02 as well as the second electrode 03 is infinitely small, which can reduce the power consumption of the display substrate. In addition, the width of the black matrix (the black matrix parallel or substantially parallel to the gate line) of the display substrate for shielding the gate electrode 01 in the direction perpendicular or substantially perpendicular to the extending direction of the gate line only needs to be greater than d(L=5 μm), which is about 33% of the width shown in FIG. 3, and the transmittance of the display substrate can be greatly improved. Meanwhile, since the width of the pixel in the extending direction of the gate line is 21 μm, b only needs to be less than (21−W)/2=(21−5)/2=8 μm, and the light shielding effect of the thin-film transistor can be greatly improved.

It should be noted that the various embodiments described herein are described in a progressive manner with reference to the same or similar parts throughout the various embodiments, with each embodiment focusing on differences from the other embodiments. In particular, the embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the present disclosure has been described with reference to specific embodiments thereof, it will be understood by those skilled in the art that various changes may be made and equivalents may be substituted for elements thereof without departing from the scope of the disclosure. Accordingly, the protection sought herein is as set forth in the claims below.

What is claimed is:

1. A thin-film transistor, comprising:
a base substrate;
a gate electrode on the base substrate;
an active layer on a side of the gate electrode away from the base substrate, an orthographic projection of the active layer onto the base substrate overlapping with an orthographic projection of the gate electrode onto the base substrate; and
a first electrode and a second electrode on a side of the active layer away from the base substrate, the first electrode being one of a source electrode and a drain electrode, and the second electrode being the other of the source electrode and the drain electrode,
wherein the active layer comprises a channel region corresponding to a gap between the first electrode and the second electrode, and a width direction of the channel region is perpendicular or substantially perpendicular to an extending direction of the gate electrode; and
wherein the extending direction of the gate electrode is perpendicular or substantially perpendicular to an extending direction of a gate line in a display substrate comprising the thin-film transistor; the gate electrode is connected to the gate line;
wherein the active layer comprises a first boundary and a second boundary that are parallel or substantially parallel to the extending direction of the gate electrode, the gate electrode comprises a third boundary and a fourth boundary that are parallel or substantially parallel to the extending direction of the gate electrode; and the shortest distance between the first boundary and the third boundary is b, and b is greater than 5 μm;
wherein orthographic projections of the first electrode and the second electrode onto the base substrate do not overlap with the orthographic projection of the gate electrode onto the base substrate;
wherein in a region where the orthographic projection of the active layer onto the base substrate overlaps with the orthographic projection of the gate electrode onto the base substrate, a width of the gate electrode is greater than a width of the gate line along the extending direction of the gate electrode.

2. The thin-film transistor according to claim 1, wherein a distance between the first boundary and the third boundary is smaller than a distance between the first boundary and the fourth boundary.

3. The thin-film transistor according to claim 1, wherein the gate electrode comprises a fifth boundary and a sixth boundary perpendicular to or substantially perpendicular to the extending direction of the gate electrode, the shortest distance between the fifth boundary and the sixth boundary is d, the channel region comprises a seventh boundary and an eighth boundary perpendicular to or substantially perpendicular to the extending direction of the gate electrode, and the shortest distance between the seventh boundary and the eighth boundary is L, wherein a difference between d and L is less than or equal to 4 μm.

4. The thin-film transistor according to claim 1, wherein the shortest distance between a first orthographic projection of the first electrode onto the base substrate and a second orthographic projection of the gate electrode onto the base substrate is a, and the shortest distance between a third orthographic projection of the second electrode onto the base substrate and the second orthographic projection of the gate electrode onto the base substrate is also a.

5. The thin-film transistor according to claim 1, wherein the width of the first electrode in a direction perpendicular to the extending direction of the gate electrode is the same as the width of the second electrode in the direction perpendicular to the extending direction of the gate electrode, both being c.

6. The thin-film transistor according to claim 5, wherein c is greater than W, a difference between c and W is 2-3 μm, and W is the width of the channel region of the thin-film transistor.

7. A display substrate, comprising a thin-film transistor, a gate electrode of the thin-film transistor being connected to a gate line of the display substrate, and an extending direction of the gate electrode being perpendicular or substantially perpendicular to an extending direction of the gate line,
the thin-film transistor comprising:
a base substrate;
the gate electrode on the base substrate;
an active layer on a side of the gate electrode away from the base substrate, an orthographic projection of the active layer onto the base substrate overlapping with an orthographic projection of the gate electrode onto the base substrate; and
a first electrode and a second electrode on a side of the active layer away from the base substrate, the first electrode being one of a source electrode and a drain electrode, and the second electrode being the other of the source electrode and the drain electrode, wherein the active layer comprises a channel region corresponding to a gap between the first electrode and the second electrode, and a width direction of the channel region is perpendicular or substantially perpendicular to the extending direction of the gate electrode;

wherein the active layer comprises a first boundary and a second boundary that are parallel or substantially parallel to the extending direction of the gate electrode, the gate electrode comprises a third boundary and a fourth boundary that are parallel or substantially parallel to the extending direction of the gate electrode; and the shortest distance between the first boundary and the third boundary is b, and b is greater than 5 μm;

wherein orthographic projections of the first electrode and the second electrode onto the base substrate do not overlap with the orthographic projection of the gate electrode onto the base substrate;

wherein in a region where the orthographic projection of the active layer onto the base substrate overlaps with the orthographic projection of the gate electrode onto the base substrate, a width of the gate electrode is greater than a width of the gate line along the extending direction of the gate electrode.

8. The display substrate according to claim 7, wherein a data line of the display substrate is connected to the first electrode or the second electrode via a lead, and the lead is parallel or substantially parallel to the gate line.

9. The display substrate according to claim 7, wherein a distance between the first boundary and the third boundary is smaller than a distance between the first boundary and the fourth boundary.

10. The display substrate according to claim 7, wherein the gate electrode comprises a fifth boundary and a sixth boundary perpendicular to or substantially perpendicular to the extending direction of the gate electrode, the shortest distance between the fifth boundary and the sixth boundary is d, the channel region comprises a seventh boundary and an eighth boundary perpendicular to or substantially perpendicular to the extending direction of the gate electrode, and the shortest distance between the seventh boundary and the eighth boundary is L, wherein a difference between d and L is less than or equal to 4 μm.

11. The display substrate according to claim 7, wherein the shortest distance between a first orthographic projection of the first electrode onto the base substrate and a second orthographic projection of the gate electrode onto the base substrate is a, and the shortest distance between a third orthographic projection of the second electrode onto the base substrate and the second orthographic projection of the gate electrode onto the base substrate is also a.

12. A method for manufacturing a thin-film transistor, comprising:

providing a base substrate;

forming a gate electrode on the base substrate;

forming an active layer on a side of the gate electrode away from the base substrate, an orthographic projection of the active layer onto the base substrate overlapping with an orthographic projection of the gate electrode onto the base substrate; and forming a first electrode and a second electrode on a side of the active layer away from the base substrate, the first electrode being one of a source electrode and a drain electrode, and the second electrode being the other of the source electrode and the drain electrode, wherein the active layer comprises a channel region corresponding to a gap between the first electrode and the second electrode, and a width direction of the channel region is perpendicular or substantially perpendicular to an extending direction of the gate electrode;

wherein the extending direction of the gate electrode is perpendicular or substantially perpendicular to an extending direction of a gate line in a display substrate comprising the thin-film transistor;

wherein the active layer comprises a first boundary and a second boundary that are parallel or substantially parallel to the extending direction of the gate electrode, the gate electrode comprises a third boundary and a fourth boundary that are parallel or substantially parallel to the extending direction of the gate electrode; and the shortest distance between the first boundary and the third boundary is b, and b is greater than 5 μm;

wherein orthographic projections of the first electrode and the second electrode onto the base substrate do not overlap with the orthographic projection of the gate electrode onto the base substrate;

wherein in a region where the orthographic projection of the active layer onto the base substrate overlaps with the orthographic projection of the gate electrode onto the base substrate, a width of the gate electrode is greater than a width of the gate line along the extending direction of the gate electrode.

* * * * *